(12) United States Patent
Koya et al.

(10) Patent No.: US 11,289,434 B2
(45) Date of Patent: Mar. 29, 2022

(54) SEMICONDUCTOR ELEMENT AND POWER AMPLIFICATION DEVICE

(71) Applicant: Murata Manufacturing Co., Ltd., Kyoto-fu (JP)

(72) Inventors: Shigeki Koya, Nagaokakyo (JP); Yasunari Umemoto, Nagaokakyo (JP); Isao Obu, Nagaokakyo (JP); Masao Kondo, Nagaokakyo (JP); Yuichi Saito, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/904,775

(22) Filed: Jun. 18, 2020

(65) Prior Publication Data
US 2020/0402932 A1 Dec. 24, 2020

(30) Foreign Application Priority Data
Jun. 18, 2019 (JP) .............................. JP2019-112745

(51) Int. Cl.
*H01L 23/66* (2006.01)
*H01L 23/00* (2006.01)
*H03F 3/195* (2006.01)

(52) U.S. Cl.
CPC .............. *H01L 23/66* (2013.01); *H01L 24/13* (2013.01); *H01L 24/20* (2013.01);
(Continued)

(58) Field of Classification Search
CPC . H01L 2224/13013; H01L 2924/13051; H01L 24/13; H01L 24/20; H01L 23/66; H03F 3/195; H03F 3/20
(Continued)

(56) References Cited

U.S. PATENT DOCUMENTS

2004/0164407 A1* 8/2004 Nakajima ........... H01L 23/5227
257/724
2018/0218921 A1* 8/2018 Shimamoto ............. H01L 24/14
(Continued)

FOREIGN PATENT DOCUMENTS

CN 109659286 A 4/2019
JP H09-266210 A 10/1997
(Continued)

OTHER PUBLICATIONS

An Office Action mailed by Taiwan Intellectual Property Office dated Feb. 2, 2021, which corresponds to Taiwanese Patent Application No. 109118300 and is related to U.S. Appl. No. 16/904,775; with English language translation.

*Primary Examiner* — Didarul A Mazumder
(74) *Attorney, Agent, or Firm* — Studebaker & Brackett PC

(57) ABSTRACT

A semiconductor element includes a semiconductor substrate, first and second amplifiers provided on the semiconductor substrate and adjacently provided in a first direction, a first reference potential bump provided on a main surface of the semiconductor substrate, and connecting the first amplifier and a reference potential, a second reference potential bump provided on the main surface, being adjacent to the first reference potential bump in the first direction, and connecting the second amplifier and a reference potential, and a rectangular bump provided on the main surface, provided between the first and second reference potential bumps in a plan view, and formed such that a second width in a second direction orthogonal to the first direction is larger than a first width in the first direction. The second width is larger than a width of at least one of the first and second reference potential bumps in the second direction.

20 Claims, 14 Drawing Sheets

(52) U.S. Cl.
CPC ............... *H01L 2224/13013* (2013.01); *H01L 2924/13051* (2013.01); *H03F 3/195* (2013.01)

(58) Field of Classification Search
USPC ......................................................... 257/728
See application file for complete search history.

(56) References Cited

U.S. PATENT DOCUMENTS

| | | | |
|---|---|---|---|
| 2019/0103847 A1* | 4/2019 | Soga | .................... H03F 1/0216 |
| 2019/0109066 A1 | 4/2019 | Kondo et al. | |
| 2019/0148172 A1 | 5/2019 | Shimamoto | |
| 2019/0312115 A1* | 10/2019 | Yamada | .................. H03F 3/195 |

FOREIGN PATENT DOCUMENTS

| | | |
|---|---|---|
| JP | 2004-364153 A | 12/2004 |
| JP | 2005-033350 A | 2/2005 |
| JP | 2007-194305 A | 8/2007 |
| TW | 200905762 A | 2/2009 |
| TW | 201843791 A | 12/2018 |
| WO | 2019/066997 A1 | 4/2019 |

* cited by examiner

SEMICONDUCTOR ELEMENT AND POWER AMPLIFICATION DEVICE

CROSS-REFERENCE TO RELATED APPLICATION

This application claims benefit of priority to Japanese Patent Application No. 2019-112745, filed Jun. 18, 2019, the entire content of which is incorporated herein by reference.

BACKGROUND

Technical Field

The present disclosure relates to a semiconductor element and a power amplification device.

Background Art

Japanese Unexamined Patent Application Publication No. 2005-33350 discloses a radio frequency power amplification module including a first power amplification unit and a second power amplification unit provided in a semiconductor chip. In the radio frequency power amplification module of Japanese Unexamined Patent Application Publication No. 2005-33350, a plurality of bumps is provided between the first power amplification unit and the second power amplification unit on a main surface of the semiconductor chip. In the radio frequency power amplification module of Japanese Unexamined Patent Application Publication No. 2005-33350, a radio frequency signal propagating between the first power amplification unit and the second power amplification unit is trapped by the trap bumps, and electromagnetic coupling can be suppressed.

In a semiconductor element and a power amplification device provided with a plurality of power amplifiers, it is required to improve heat dissipation characteristics in order to improve performance and to ensure reliability. In Japanese Unexamined Patent Application Publication No. 2005-33350, the plurality of trap bumps is circular in a plan view, and is arranged with intervals therebetween. Therefore, there is a possibility that heat is transferred between the first power amplification unit and the second power amplification unit through the intervals between the plurality of trap bumps.

SUMMARY

Accordingly, the present disclosure provides a semiconductor element and a power amplification device capable of improving heat dissipation characteristics.

A semiconductor element according to an aspect of the present disclosure includes a semiconductor substrate, a first amplifier and a second amplifier that are provided on the semiconductor substrate and that are adjacent to each other in a first direction, a first reference potential bump provided on the main surface of the semiconductor substrate and connecting the first amplifier and a reference potential to each other, a second reference potential bump provided on the main surface of the semiconductor substrate, being adjacent to the first reference potential bump in the first direction, and connecting the second amplifier and a reference potential to each other, and a rectangular bump provided on the main surface of the semiconductor substrate, provided between the first reference potential bump and the second reference potential bump in a plan view from a direction perpendicular to the main surface, and formed such that a second width in a second direction orthogonal to the first direction is larger than a first width in the first direction. The second width of the rectangular bump is larger than a width of at least one of the first reference potential bump and the second reference potential bump in the second direction.

A power amplification device according to an aspect of the present disclosure includes the semiconductor element described above, and a module substrate facing the semiconductor element and electrically connected to the semiconductor element. The module substrate includes an insulating substrate having a first surface facing a main surface of the semiconductor substrate and a second surface opposite to the first surface, and a plurality of first wirings provided on the first surface of the insulating substrate, connected to the first reference potential bump, the second reference potential bump, and the rectangular bump, and separated from each other.

Other features, elements, characteristics and advantages of the present disclosure will become more apparent from the following detailed description of preferred embodiments of the present disclosure with reference to the attached drawings.

DETAILED DESCRIPTION

Hereinafter, embodiments of a semiconductor element and a power amplification device according to the present disclosure will be described in detail with reference to the drawings. It should be noted that the present disclosure is not limited to the embodiments. The embodiments are merely examples, and it will be apparent that partial replacements or combinations of the configurations shown in the different embodiments can be made. In the second and subsequent embodiments, descriptions of matters common to those in the first embodiment will be omitted, and only different points will be described. In particular, similar working effects according to the similar configurations will not be described in detail for each embodiment.

First Embodiment

Figure 1:
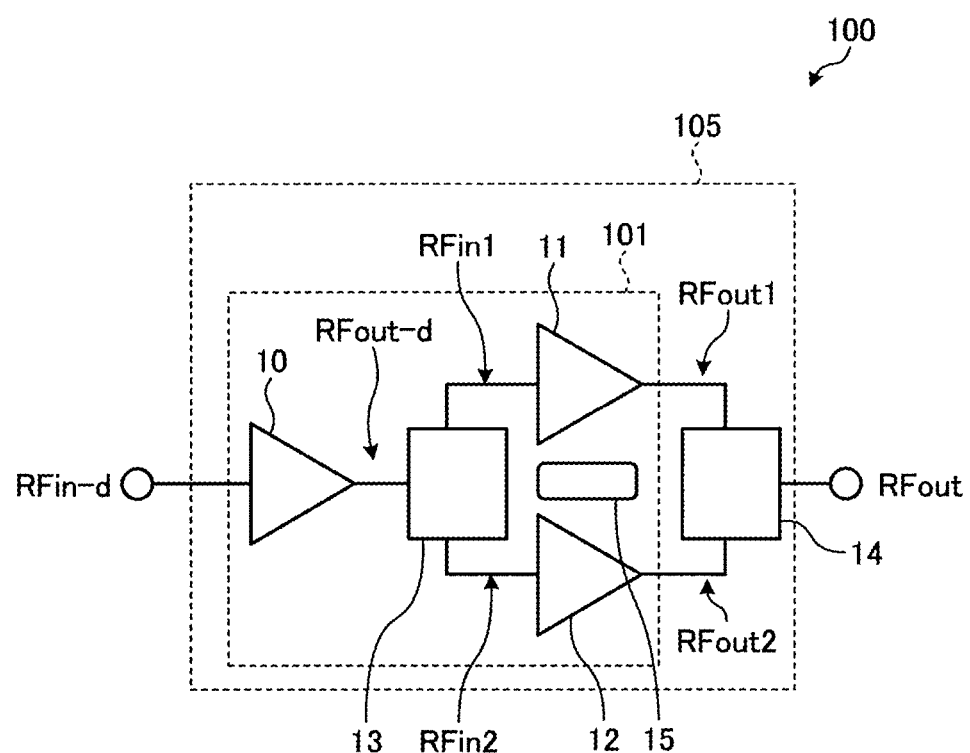
FIG. 1 is a block diagram illustrating a configuration of a power amplification device according to a first embodiment.

FIG. 1 is a block diagram illustrating a configuration of a power amplification device according to a first embodiment. As illustrated in FIG. 1, a power amplification device 100 includes a semiconductor element 101 and a module substrate 105. The semiconductor element 101 includes a drive stage amplifier 10, a power splitter 13, a first amplifier 11, a second amplifier 12, and a rectangular bump 15. The module substrate 105 includes a coupler 14. The semiconductor element 101 is mounted on the module substrate 105, and the first amplifier 11 and the second amplifier 12 of the semiconductor element 101 are electrically connected to the coupler 14.

The drive stage amplifier 10 amplifies an input radio frequency input signal RFin-d and outputs an amplified signal RFout-d. The drive stage amplifier 10 is an amplification circuit including, for example, a heterojunction bipolar transistor (HBT). As a frequency of the radio frequency input signal RFin-d, frequencies about from several hundreds of MHz (megahertz) to several tens of GHz (gigahertz) are exemplified, but the present disclosure is not limited thereto.

The power splitter 13 separates the amplified signal RFout-d supplied from the drive stage amplifier 10 into a first radio frequency signal RFin1 and a second radio frequency signal RFin2. The power splitter 13 is configured with, for example, a transformer. The first radio frequency signal RFin1 and the second radio frequency signal RFin2 are differential signals, and for example, the first radio frequency signal RFin1 is a radio frequency signal having a positive polarity and the second radio frequency signal RFin2 is a radio frequency signal having a negative polarity.

The first amplifier 11 and the second amplifier 12 configure a differential amplification circuit. The first amplifier 11 amplifies the first radio frequency signal RFin1, and outputs a first output signal RFout1. The second amplifier 12 amplifies the second radio frequency signal RFin2, and outputs a second output signal RFout2.

The coupler 14 converts the first output signal RFout1 and the second output signal RFout2 which are a pair of differential signals into a radio frequency output signal RFout, and outputs the radio frequency output signal RFout. The coupler 14 is configured with, for example, a transformer.

The rectangular bump 15 is disposed between the first amplifier 11 and the second amplifier 12. The rectangular bump 15 is spaced apart from the first amplifier 11 and the second amplifier 12 on the semiconductor element 101, and is provided to dissipate heat generated by the semiconductor element 101 or to transfer the heat to the outside.

Figure 2:
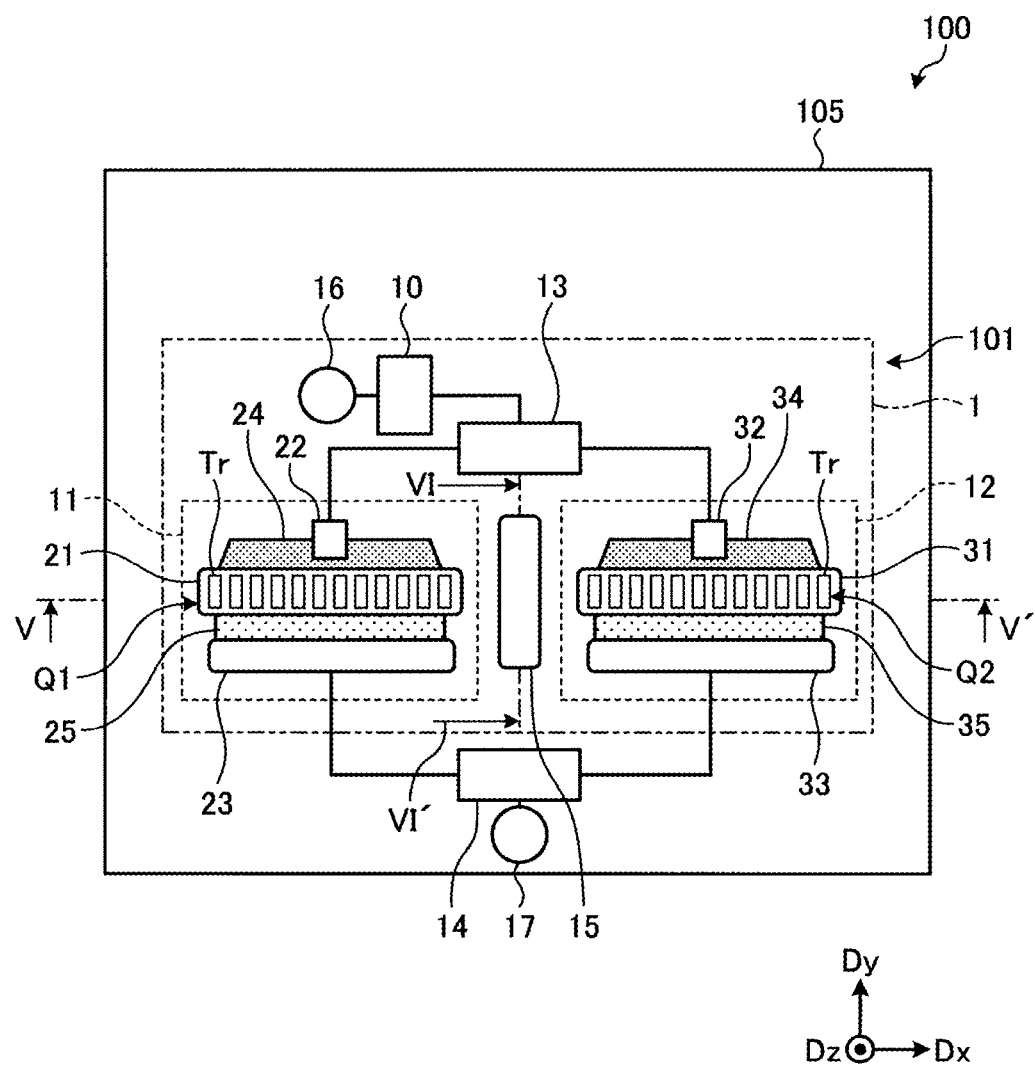
FIG. 2 is a plan view illustrating a power amplification device according to the first embodiment.

FIG. 2 is a plan view illustrating a power amplification device according to the first embodiment. Note that, in FIG. 2, a semiconductor substrate 1 of the semiconductor element 101 is indicated by a dashed-two dotted line for easy viewing of the drawings.

As illustrated in FIG. 2, the drive stage amplifier 10, the first amplifier 11, the second amplifier 12, the power splitter 13, the rectangular bump 15, and a terminal 16 are provided on the semiconductor substrate 1. The coupler 14 and the terminal 17 are provided on the module substrate 105.

In the following description, one direction in a plane parallel to a front surface of the semiconductor substrate 1 will be referred to as a first direction Dx. In addition, a direction orthogonal to the first direction Dx in a plane parallel to the front surface of the semiconductor substrate 1 is referred to as a second direction Dy. In addition, a direction orthogonal to the first direction Dx and the second direction Dy will be referred to as a third direction Dz. The third direction Dz is a direction perpendicular to the semiconductor substrate 1. In the specification, the term "plan view" refers to a positional relationship in a view from the third direction Dz.

The radio frequency input signal RFin-d is input to the terminal 16. The terminal 16 is connected to the drive stage amplifier 10. The drive stage amplifier 10 is connected to an input terminal 22 of the first amplifier 11 and an input terminal 32 of the second amplifier 12 with the power splitter 13 interposed therebetween. An output terminal 23 of the first amplifier 11 and an output terminal 33 of the second amplifier 12 are connected to the terminal 17 with the coupler 14 interposed therebetween. The terminal 17 outputs the radio frequency output signal RFout.

The first amplifier 11 includes a first transistor group Q1 including a plurality of transistors Tr, a first reference potential bump 21, the input terminal 22, the output terminal 23, a first connection wiring 24, and a second connection wiring 25. The plurality of transistors Tr is arrayed in the first direction Dx. Each of the plurality of transistors Tr is, for example, a heterojunction bipolar transistor. Note that the transistor Tr is not limited thereto, and another configuration such as a field-effect transistor (FET) can be employed.

Figure 3:
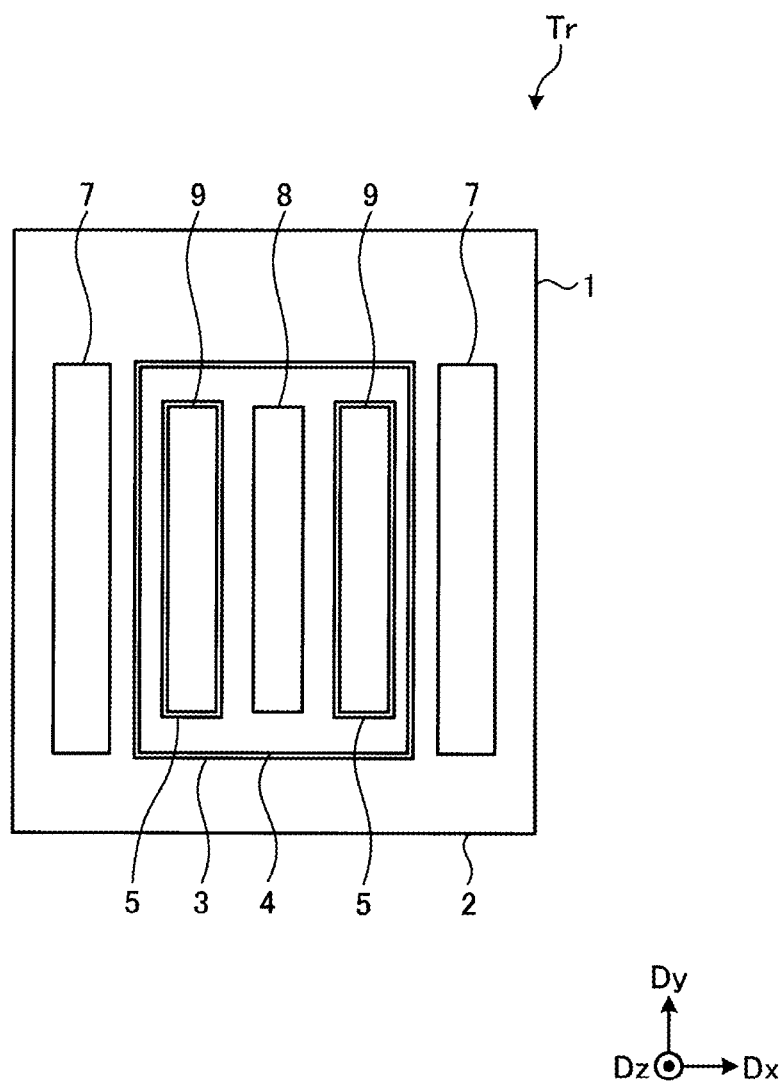
FIG. 3 is a plan view illustrating a transistor included in the power amplification device.

FIG. 3 is a plan view illustrating a transistor included in the power amplification device. Also, FIG. 3 schematically illustrates an enlarged plan view of one transistor Tr. As illustrated in FIG. 3, the transistor Tr includes a sub-collector layer 2, a collector layer 3, a base layer 4, emitter layers 5, and various electrodes and wirings. The sub-collector layer 2, the collector layer 3, the base layer 4, and the emitter layers 5 are laminated on the semiconductor substrate 1 in this order. The two emitter layers 5 are arranged adjacent to each other in the first direction Dx.

Two collector electrodes 7 are collaterally arranged on the sub-collector layer 2 in the first direction Dx, and the collector layer 3 is provided between the two collector electrodes 7. Note that although one transistor Tr is illustrated in FIG. 3, the collector electrode 7 may be shared by adjacent transistors Tr. That is, one collector electrode 7 may be provided between the transistors Tr adjacent to each other.

A base electrode 8 is provided on the base layer 4. In a plan view, the base electrode 8 is disposed between the emitter layers 5 adjacent to each other in the first direction Dx. An emitter electrode 9 is provided on the emitter layer 5.

The first connection wiring 24 illustrated in FIG. 2 connects the base electrodes 8 of the plurality of transistors Tr and the input terminal 22. The second connection wiring 25 connects the collector electrodes 7 of the plurality of transistors Tr and the output terminal 23. The first reference potential bump 21 is arranged so as to overlap the plurality of transistors Tr, and a width in the first direction Dx is larger than a width in the second direction Dy. The first reference potential bump 21 connects the emitter electrodes 9 of the plurality of transistors Tr of the first amplifier 11 and a reference potential. The reference potential is, for example, a ground potential.

The second amplifier 12 is arranged adjacent to the first amplifier 11 in the first direction Dx. The second amplifier 12 includes a second transistor group Q2 including a plurality of transistors Tr, a second reference potential bump 31, the input terminal 32, the output terminal 33, a first connection wiring 34, and a second connection wiring 35. The plurality of transistors Tr is arrayed in the first direction Dx.

The first connection wiring 34 connects the base electrodes 8 of the plurality of the transistors Tr of the second transistor group Q2 and the input terminal 32. The input terminal 22 of the first amplifier 11 and the input terminal 32 of the second amplifier 12 are connected to the power splitter 13. The second connection wiring 35 connects the collector electrodes 7 of the plurality of transistors Tr and the output terminal 33. The output terminal 23 of the first amplifier 11 and the output terminal 33 of the second amplifier 12 are connected to the coupler 14. The second reference potential bump 31 is arranged so as to overlap the plurality of transistors Tr, and a width in the first direction Dx is larger than a width in the second direction Dy. The second reference potential bump 31 connects the emitter electrodes 9 of the plurality of transistors Tr of the second amplifier 12 and the reference potential.

The second amplifier 12 has a configuration similar to that of the first amplifier 11. However, the second amplifier 12 may have a configuration different from that of the first amplifier 11. For example, the number of the plurality of transistors Tr included in the second transistor group Q2 may be different from the number of the plurality of transistors Tr included in the first transistor group Q1. In addition, an arrangement direction of the plurality of transistors Tr included in the second transistor group Q2 may be different from an arrangement direction of the plurality of transistors Tr included in the first transistor group Q1.

The rectangular bump 15 is provided between the first reference potential bump 21 and the second reference potential bump 31 adjacent to each other in the first direction Dx in a plan view. The rectangular bump 15 is spaced apart from the first reference potential bump 21 and the second reference potential bump 31 on the semiconductor substrate 1. The rectangular bump 15 has a substantially rectangular shape in a plan view. However, the rectangular bump 15 may have a shape long in the second direction Dy, and may have another shape such as a substantially oval shape, elliptical shape, rectangular shape. As the rectangular bump 15, for example, a metal material having good thermal conductivity such as copper (Cu), or gold (Au) is used.

Figure 4:
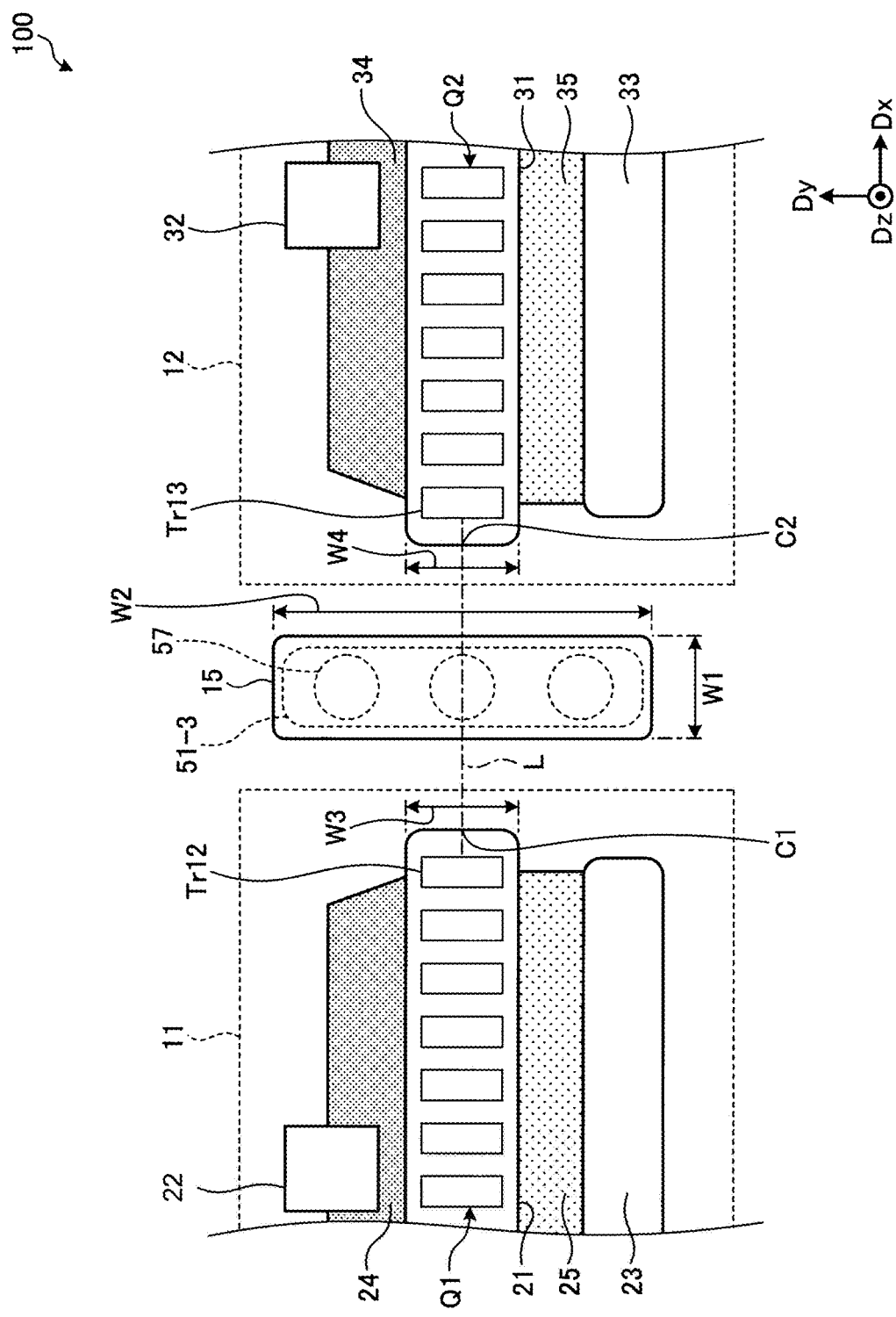
FIG. 4 is an enlarged plan view illustrating a rectangular bump, a first amplifier, and a second amplifier according to the first embodiment.

FIG. 4 is an enlarged plan view illustrating a rectangular bump, a first amplifier, and a second amplifier according to the first embodiment. As illustrated in FIG. 4, in the rectangular bump 15, a second width W2 in the second direction Dy is larger than a first width W1 in the first direction Dx. The rectangular bump 15 is provided continuously and integrally without being provided with a slit or the like from one end to the other end in the second direction Dy.

Further, a position of the rectangular bump 15 in the second direction Dy overlap positions of the first reference potential bump 21 and the second reference potential bump 31 in the second direction Dy. That is, the rectangular bump 15 intersects with a virtual line L. The virtual line L is a virtual line connecting a center C1 of a width W3 of the first reference potential bump 21 in the second direction Dy and a center C2 of a width W4 of the second reference potential bump 31 in the second direction Dy. The second width W2 of the rectangular bump 15 is larger than the width W3 of the first reference potential bump 21 in the second direction Dy. Further, the second width W2 of the rectangular bump 15 is larger than the width W4 of the second reference potential bump 31 in the second direction Dy.

As described above, since the rectangular bump 15 is provided in a substantially rectangular shape or a substantially oval shape, it is possible to improve the heat dissipation characteristics as compared with a case where a substantially circular bump having an aspect ratio of approximately 1 (for example, the second width W2 and the first width W1 are approximately equal to each other) is provided. Further, since the rectangular bump 15 is provided between the first amplifier 11 and the second amplifier 12, the rectangular bump 15 can suppress transfer of heat between the first transistor group Q1 and the second transistor group Q2.

Figure 5:
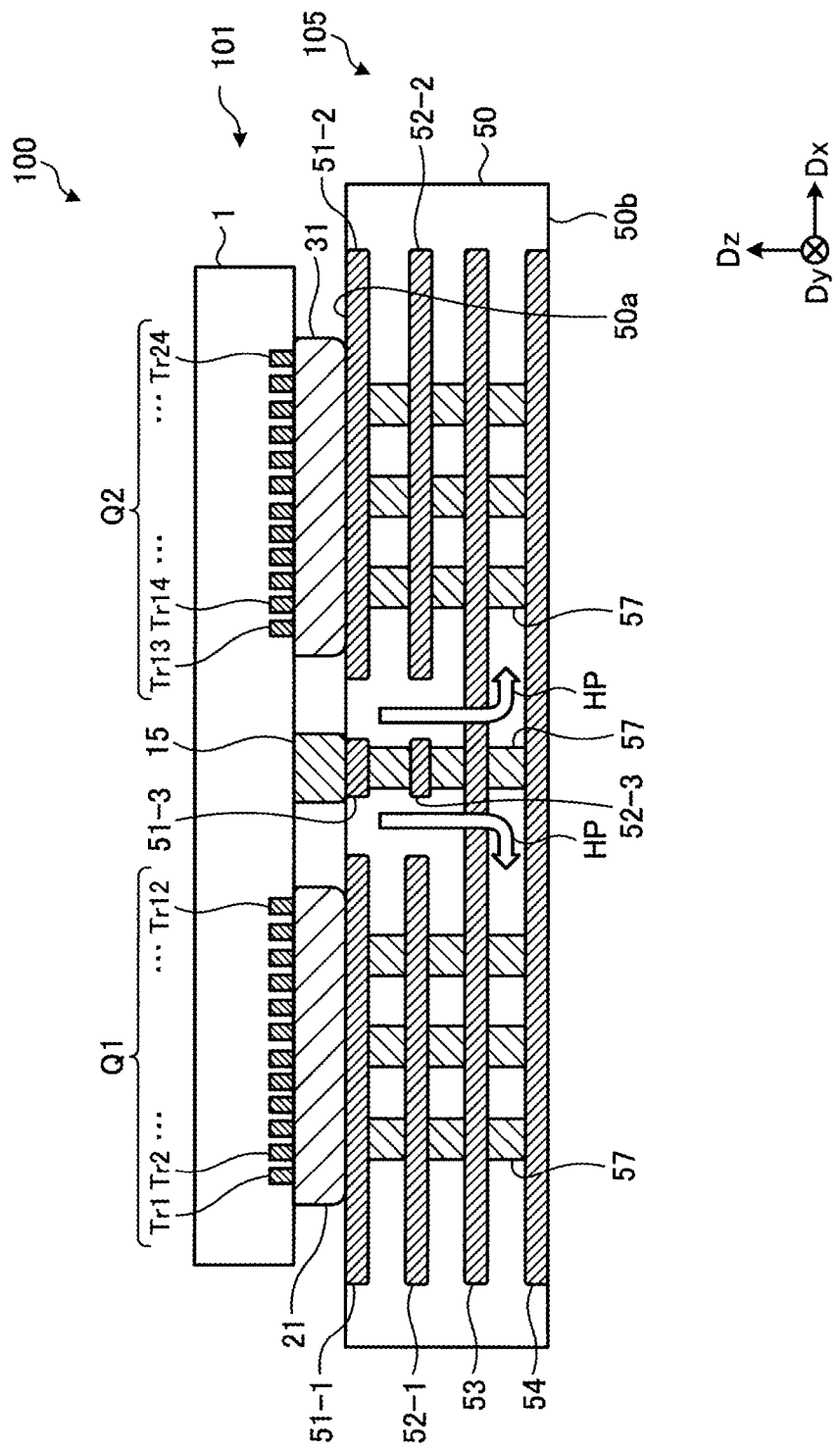
FIG. 5 is a cross-sectional view taken along a line V-V' in FIG. 2.
Figure 6:
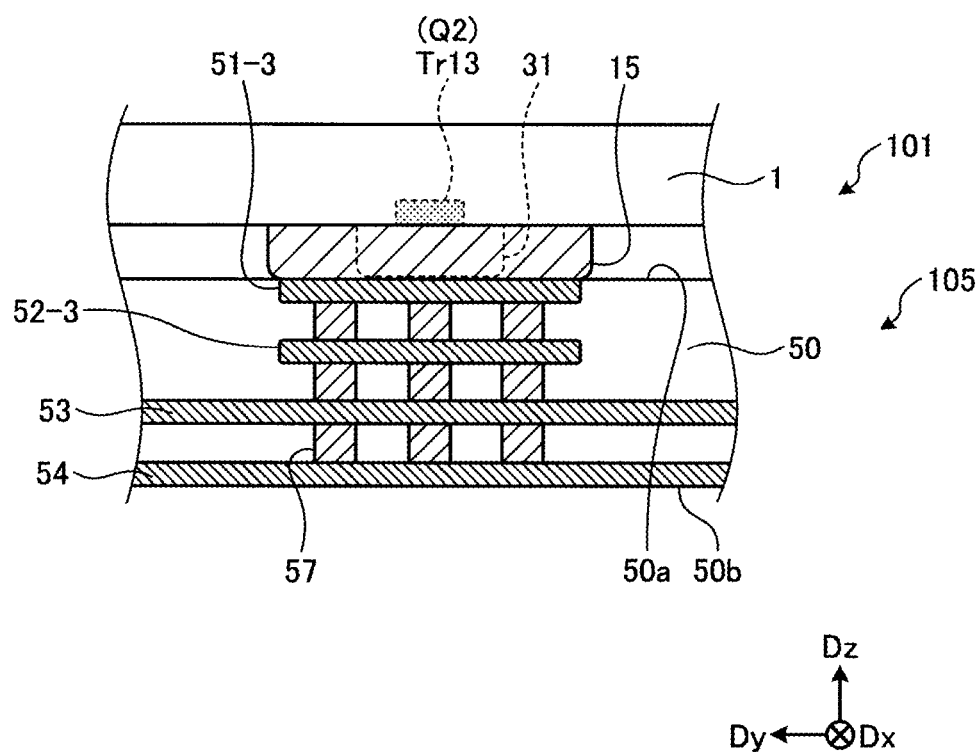
FIG. 6 is a cross-sectional view taken along a VI-VI' in FIG. 2.

Next, a cross-sectional structure of the power amplification device 100 will be described. FIG. 5 is a cross-sectional view taken along a line V-V' in FIG. 2. FIG. 6 is a cross-sectional view taken along a line VI-VI' in FIG. 2. As illustrated in FIG. 5, a main surface of the semiconductor element 101 is provided so as to face an upper surface of the module substrate 105. The first reference potential bump 21, the second reference potential bump 31, and the rectangular bump 15 are provided on the same main surface of the semiconductor element 101. A height of the rectangular bump 15 in the third direction Dz is equal to heights of the first reference potential bump 21 and the second reference potential bump 31 in the third direction Dz. Lower surfaces of the first reference potential bump 21, the second reference potential bump 31, and the rectangular bump 15 are respectively connected to first wirings 51-1, 51-2, and 51-3 provided in or on the upper surface of the module substrate 105.

The module substrate 105 includes an insulating substrate 50, the first wirings 51-1, 51-2, and 51-3, second wirings 52-1, 52-2, and 52-3, a third wiring 53, a fourth wiring 54, and vias 57. The insulating substrate 50 is a ceramic substrate or a printed circuit board, and is formed by laminating a plurality of dielectric layers. Note that, in the following description, when it is not necessary to distinguish and describe the first wirings 51-1, 51-2, and 51-3 from each other, they may be simply referred to as first wirings 51. Similarly, the second wirings 52-1, 52-2, and 52-3 may be simply referred to as second wirings 52.

The insulating substrate 50 has a first surface 50a and a second surface 50b on a side opposite to the first surface 50a. The first surface 50a faces a main surface of the semiconductor substrate 1. The first wiring 51, the second wiring 52, the third wiring 53, and the fourth wiring 54 are laminated in this order from a side of the first surface 50a of the insulating substrate 50 toward a side of the second surface 50b. The first wirings 51 are provided in or on the first surface 50a of the insulating substrate 50, and are provided in a layer closest to the semiconductor element 101.

The second wirings 52 are provided in an inner layer of the insulating substrate 50. More specifically, the second wirings 52 are provided in a second layer from the first surface 50a of the insulating substrate 50. That is, the second wiring 52 is laminated with the first wiring 51 with the dielectric layer interposed therebetween. The third wiring 53 is provided in a third layer from the first surface 50a of the insulating substrate 50. The third wiring 53 is laminated with the second wiring 52 with the dielectric layer interposed therebetween. The fourth wiring 54 is provided in or on the second surface 50b of the insulating substrate 50, and is provided in a layer farthest from the semiconductor element 101. The fourth wiring 54 is connected to the reference potential.

The first wirings 51-1, 51-2, and 51-3 may be provided so as to be spaced apart from each other. The first reference potential bump 21 is connected to the first wiring 51-1. The second reference potential bump 31 is connected to the first wiring 51-2. The rectangular bump 15 is connected to the first wiring 51-3.

The second wirings 52-1, 52-2, and 52-3 are also provided so as to be spaced apart from each other. The second wiring 52-1 is provided at a position overlapping the first wiring 51-1, and is electrically connected to the first wiring 51-1 with the vias 57 interposed therebetween. The second wiring 52-2 is provided at a position overlapping the first wiring 51-2, and is electrically connected to the first wiring 51-2 with the vias 57 interposed therebetween. The second wiring 52-3 is provided at a position overlapping the first wiring 51-3, and is electrically connected to the first wiring 51-3 with the vias 57 interposed therebetween.

The third wiring 53 is commonly provided for the first wirings 51-1, 51-2, and 51-3, and the second wirings 52-1, 52-2, and 52-3. In other words, the third wiring 53 is continuously provided over a region overlapping the first reference potential bump 21, the second reference potential bump 31, and the rectangular bump 15. The third wiring 53 is provided at a position further away from the first surface 50a than the plurality of second wirings 52-1, 52-2, and 52-3. The third wiring 53 is electrically connected to the second wirings 52-1, 52-2, and 52-3 with a plurality of vias 57 interposed therebetween.

The fourth wiring 54 is provided in a region overlapping the third wiring 53, and is electrically connected to the third wiring 53 with a plurality of vias 57 interposed therebetween. The fourth wiring 54 is connected to the reference potential, so that the plurality of transistors Tr of the first transistor group Q1 and the plurality of transistors Tr of the second transistor group Q2 are connected to the reference potential. The third wiring 53 and the fourth wiring 54 have an area larger than those of the first wirings 51-1, 51-2, and 51-3 and the second wirings 52-1, 52-2, and 52-3. Thereby, the reference potential of the power amplification device 100 can be secured.

With such a configuration, a heat transfer path HP passing through the first wiring 51-3, the via 57, the second wiring 52-3, the via 57, the third wiring 53, the via 57, and the fourth wiring 54 is formed from the rectangular bump 15. Heat generated by each transistor Tr of the semiconductor element 101 passes through the heat transfer path HP and is transferred to the side of the second surface 50b of the insulating substrate 50. In the present embodiment, by using the first wiring 51-3 and the second wiring 52-3 provided in the layers close to the semiconductor element 101, the first wiring 51-1 is separated from the first wiring 51-2 and the second wiring 52-1 is separated from the second wiring 52-2, respectively. Therefore, in the same layers as the first wiring 51-3 and the second wiring 52-3, it is possible to prevent the heat from being returned from the rectangular bump 15 to the semiconductor element 101 without forming a heat transfer path on which heat is transferred in a horizontal direction.

Note that the module substrate 105 includes four layers of wirings, but is not limited thereto, may include three layers of wirings, and may include five or more layers of wirings. For example, three or more wiring layers may be provided so as to be spaced apart from each other by overlapping each of the first reference potential bump 21, the second reference potential bump 31, and the rectangular bump 15. Further, three or more wiring layers commonly provided for the first wirings 51-1, 51-2, and 51-3 and the second wirings 52-1, 52-2, and 52-3 may be provided.

As illustrated in FIG. 6, the first wiring 51-3 and the second wiring 52-3 extend in the second direction Dy, and are provided so as to overlap the rectangular bump 15. The first wiring 51-3 and the second wiring 52-3 are connected to each other by a plurality of vias 57 arranged in the second direction Dy. Further, the second wiring 52-3 and the third wiring 53 are also connected to each other by a plurality of vias 57 arranged in the second direction Dy. Accordingly, the heat from the semiconductor element 101 is efficiently transferred to a lower side in the third direction Dz (a side of the fourth wiring 54).

FIRST EXAMPLE

Figure 7:
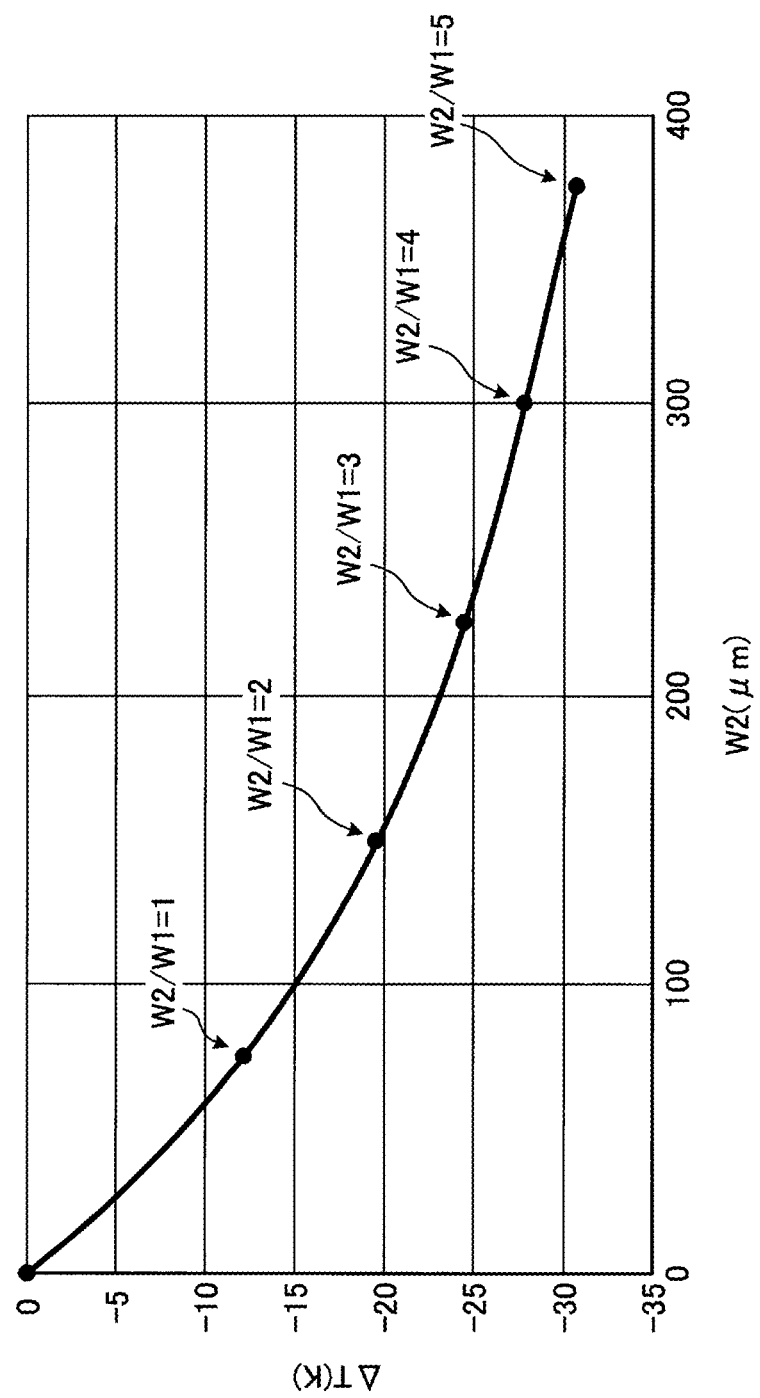
FIG. 7 is a graph for describing a relationship between a width of a rectangular bump in a second direction and a temperature drop in a power amplification device according to a first example.

FIG. 7 is a graph for describing a relationship between a width of the rectangular bump in the second direction and a temperature drop in the power amplification device according to a first example. A horizontal axis shown in FIG. 7 represents the second width W2 (μm) of the rectangular bump 15, and a vertical axis represents a temperature drop ΔT(K). The first width W1 of the rectangular bump 15 is constant (for example, W1=75 μm). The temperature drop ΔT(K) is based on a temperature in a case where the rectangular bump 15 is not provided (W2=0 μm). In addition, the temperature is calculated at a position that is an end portion of the first reference potential bump 21, and that is at the center C1 (see FIG. 4).

As shown in FIG. 7, as the second width W2 of the rectangular bump 15 increases, the temperature drop ΔT increases. More specifically, it is shown that the second width W2 is equal to or larger than 150 μm, that is, in a range where an aspect ratio (W2/W1) of the second width W2 and the first width W1 is equal to or larger than 2, the temperature drop ΔT=−20° or lower is satisfied, so that good heat dissipation characteristics can be obtained.

Figure 8:
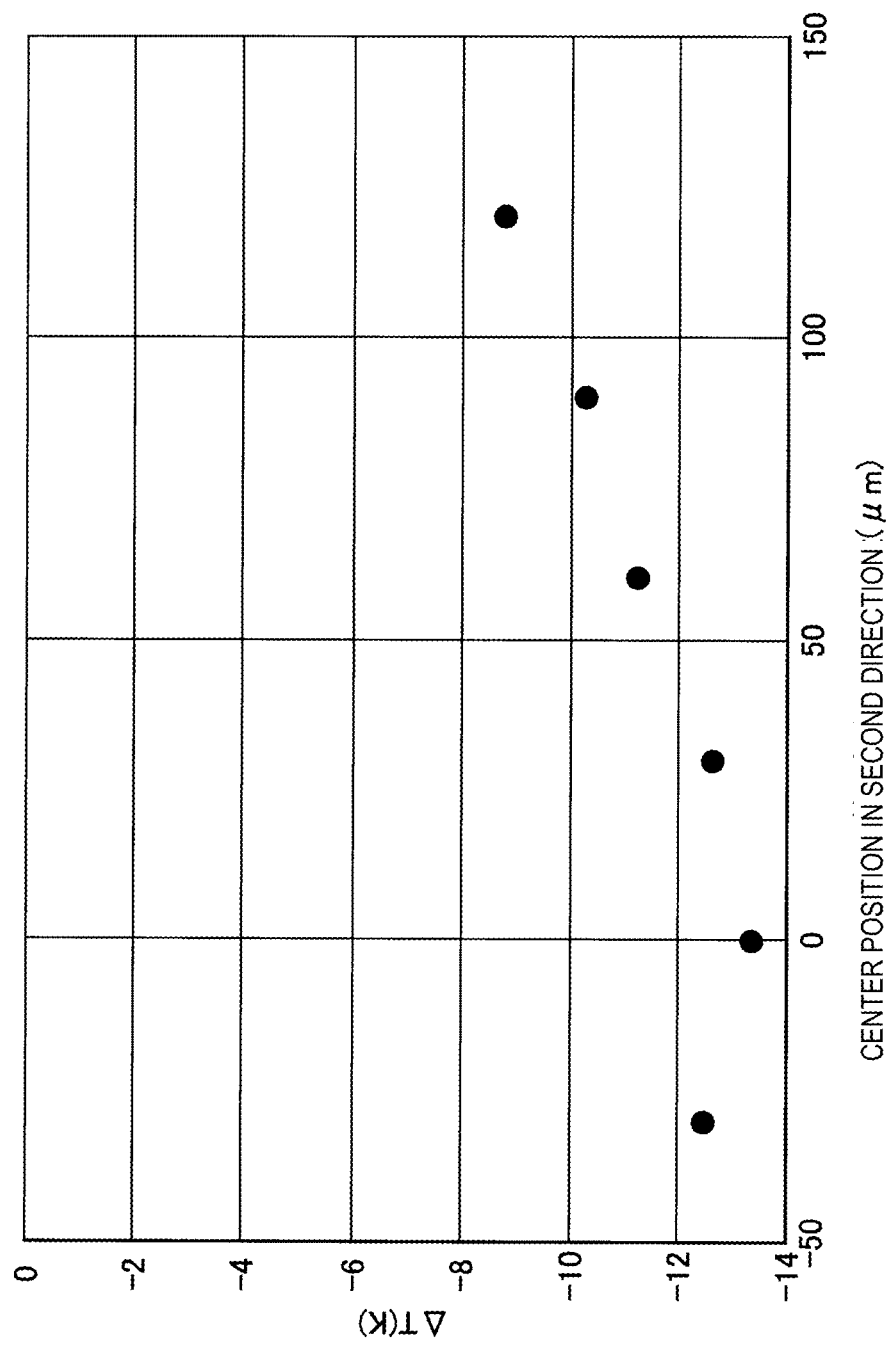
FIG. 8 is a graph for describing a relationship between a center position of the rectangular bump in the second direction and a temperature drop in the power amplification device according to the first example.

FIG. 8 is a graph for describing a relationship between a center position of the rectangular bump in the second direction and a temperature drop in the power amplification device according to the first example. FIG. 8 shows the temperature drop ΔT when a position of the rectangular bump 15 in the second direction Dy is changed. A horizontal axis of the graph shown in FIG. 8 indicates a center position of the rectangular bump 15 in the second direction Dy with reference to the position of the center C1 of the first reference potential bump 21 in the second direction Dy.

As shown in FIG. 8, when the center position of the rectangular bump 15 in the second direction Dy is 0 μm, that is, when the center position of the rectangular bump 15 in the second direction Dy coincides with the center C1 of the first reference potential bump 21 in the second direction Dy, the temperature drop ΔT becomes the largest. The temperature drop ΔT decreases as the center position in the second direction Dy shifts.

Second Embodiment

Figure 9:
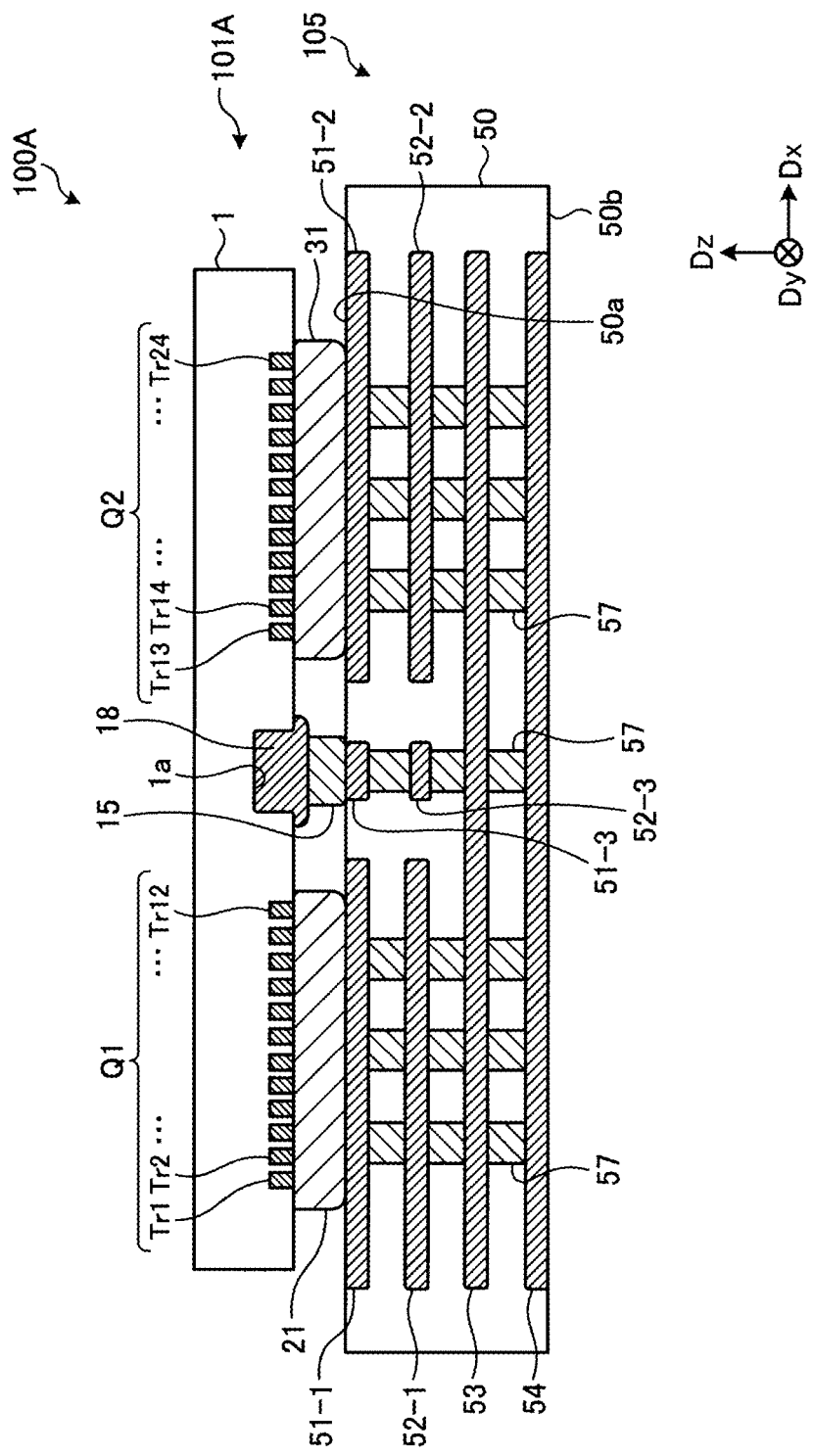
FIG. 9 is a cross-sectional view illustrating a power amplification device according to a second embodiment.

FIG. 9 is a cross-sectional view illustrating a power amplification device according to a second embodiment. In the second embodiment, a configuration in which a concave portion 1a is provided in or on the main surface of the semiconductor substrate 1, unlike the first embodiment, will be described. Note that, in the following description, the same constituent elements as those in the above-described embodiment are denoted by the same reference signs, and description thereof will be omitted.

As illustrated in FIG. 9, the concave portion 1a is provided on the main surface of the semiconductor substrate 1 in or on which the pluralities of transistors Tr are provided. A metal layer 18 is provided in the concave portion 1a. A thickness of the metal layer 18 is equal to or larger than a depth of the concave portion 1a. The metal layer 18 fills the concave portion 1a and is provided so as to overlap the main surface around the concave portion 1a.

The rectangular bump 15 is provided so as to overlap the metal layer 18. In the present embodiment, a height of the rectangular bump 15 is lower than those of the first reference potential bump 21 and the second reference potential bump 31. By adjusting the height of the rectangular bump 15, the rectangular bump 15 can connect the metal layer 18 and the first wiring 51-3. Also, the first width W1 of the rectangular bump 15 is smaller than widths of the concave portion 1a and the metal layer 18 in the first direction Dx.

In the present embodiment, a total height of the metal layer 18 and the rectangular bump 15 is higher than a height of each of the first reference potential bump 21 and the second reference potential bump 31. That is, the total height of the metal layer 18 and the rectangular bump 15 is higher than that of the rectangular bump 15 in the first embodiment. For this reason, a power amplification device 100A and a semiconductor element 101A can improve heat dissipation characteristics.

Third Embodiment

Figure 10:
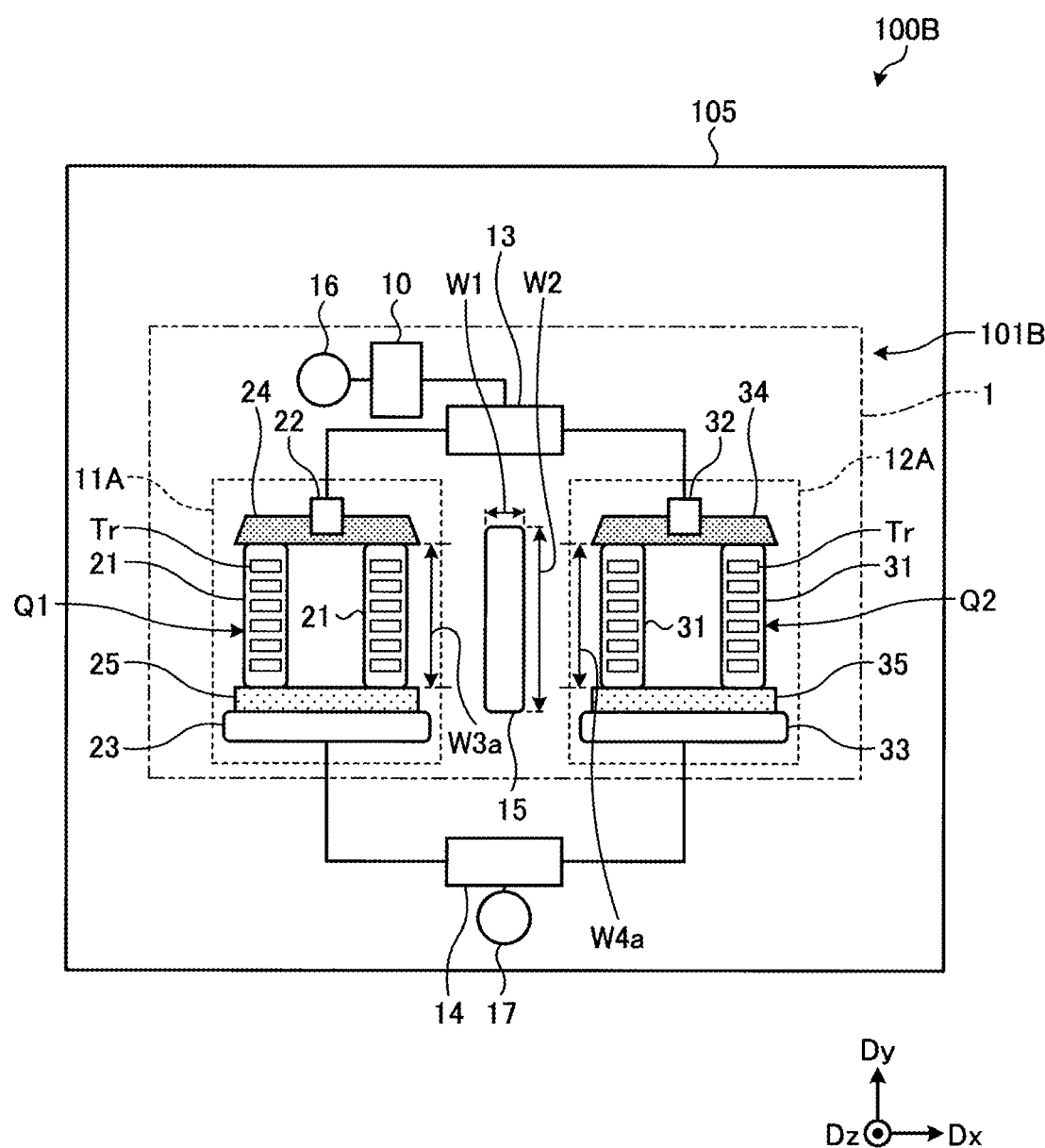
FIG. 10 is a plan view illustrating a power amplification device according to a third embodiment.

FIG. 10 is a plan view illustrating a power amplification device according to a third embodiment. In the third embodiment, a configuration in which each of a first amplifier 11A and a second amplifier 12A includes pluralities of transistors Tr arrayed in the second direction Dy will be described, unlike the first embodiment and the second embodiment described above.

As illustrated in FIG. 10, in each of the first amplifier 11A and the second amplifier 12A, the pluralities of transistors Tr are arrayed in the second direction Dy, and the pluralities of transistors Tr arrayed in the second direction Dy are arranged in the first direction Dx. In FIG. 10, two rows of the pluralities of transistors Tr are arranged in the first direction Dx, but the number of rows may be equal to or larger than three.

Each of the first reference potential bumps 21 and the second reference potential bumps 31 is arranged in a region overlapping the plurality of transistors Tr arranged in the second direction Dy, and their widths W3a and W4a in the second direction Dy are larger than their widths in the first direction Dx.

In the first amplifier 11A, a plurality of first reference potential bumps 21 is arranged side by side in the first direction Dx. In the second amplifier 12A, a plurality of second reference potential bumps 31 is arranged side by side in the first direction Dx. However, one first reference potential bump 21 and one second reference potential bump 31 may be provided, or three or more first reference potential bumps 21 may be provided side by side and three or more second reference potential bumps 31 may be provided side by side.

Also in the present embodiment, the second width W2 of the rectangular bump 15 is larger than the width W3a of the first reference potential bump 21 in the second direction Dy and the width W4a of the second reference potential bump 31 in the second direction Dy. Accordingly, a power amplification device 100B and a semiconductor element 101B can improve heat dissipation characteristics. Further, since the transistors Tr are arranged in the second direction Dy, widths of the power amplification device 100B and the semiconductor element 101B in the first direction Dx can be reduced.

Fourth Embodiment

Figure 11:
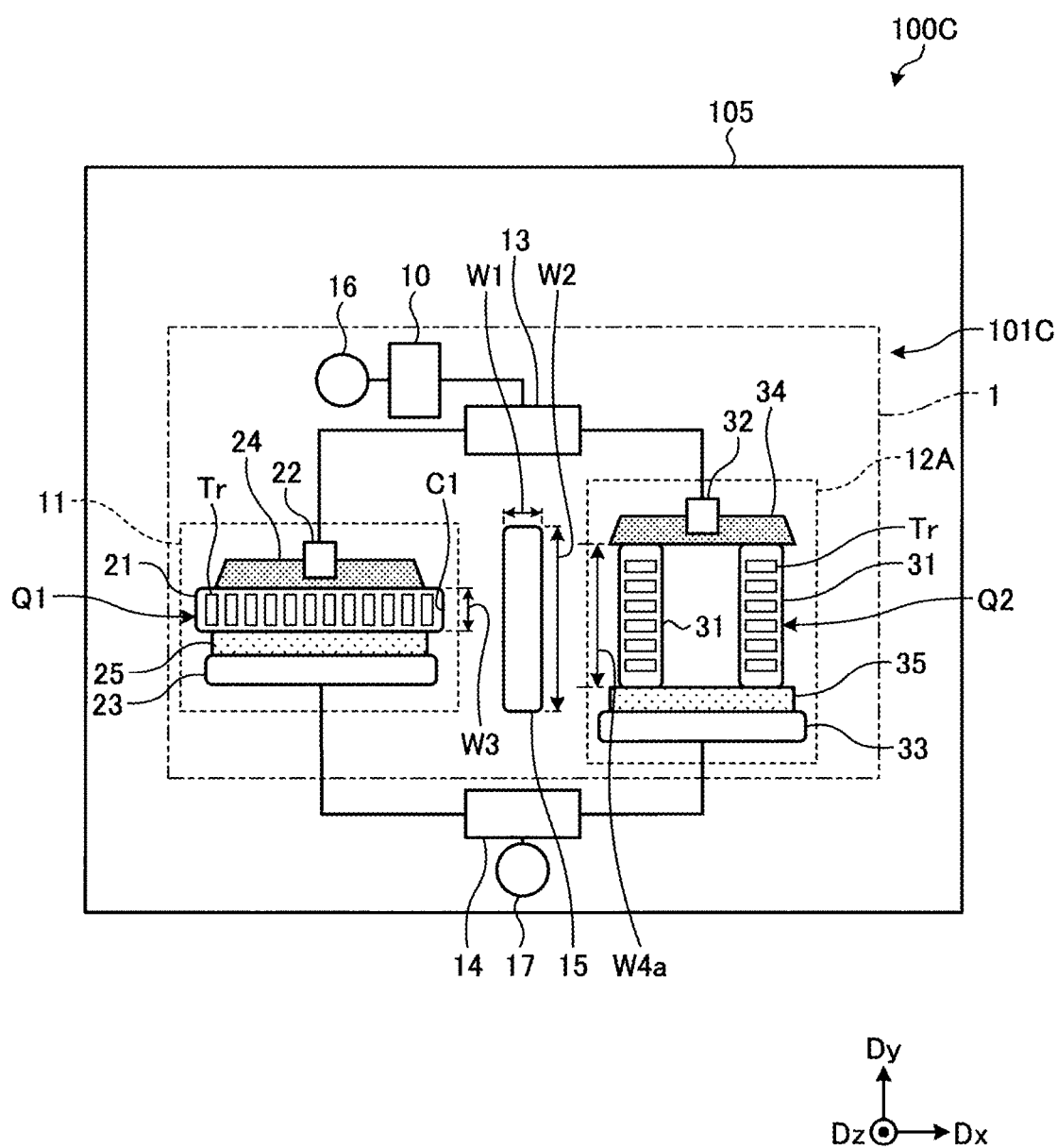
FIG. 11 is a plan view illustrating a power amplification device according to a fourth embodiment.

FIG. 11 is a plan view illustrating a power amplification device according to a fourth embodiment. In the fourth embodiment, unlike the first embodiment to the third embodiment, a configuration in which arrangement directions of pluralities of transistors Tr are different between the first amplifier 11 and the second amplifier 12A will be described.

As illustrated in FIG. 11, the first amplifier 11 includes the plurality of transistors Tr arrayed in the first direction Dx, as in the first embodiment. The first reference potential bump 21 is disposed in a region overlapping the plurality of transistors Tr arrayed in the first direction Dx, and a width in the first direction Dx is larger than the width W3 in the second direction Dy.

The second amplifier 12A also includes the pluralities of transistors Tr arrayed in the second direction Dy, as in the third embodiment. The second reference potential bump 31 is disposed in a region overlapping the plurality of transistors Tr, and the width W4a in the second direction Dy is larger than a width in the first direction Dx.

Also in the present embodiment, the second width W2 of the rectangular bump 15 is larger than the width W3 of the first reference potential bump 21 in the second direction Dy and the width W4a of the second reference potential bump 31 in the second direction Dy. Accordingly, a power amplification device 100C and a semiconductor element 101C can improve heat dissipation characteristics. Further, since the first amplifier 11 and the second amplifier 12A can have different configurations, a degree of freedom in arrangement in a circuit configuration increases. Further, the first amplifier 11 and the second amplifier 12A may be applied to an amplification circuit different from the differential amplification circuit.

SECOND EXAMPLE

Figure 12:
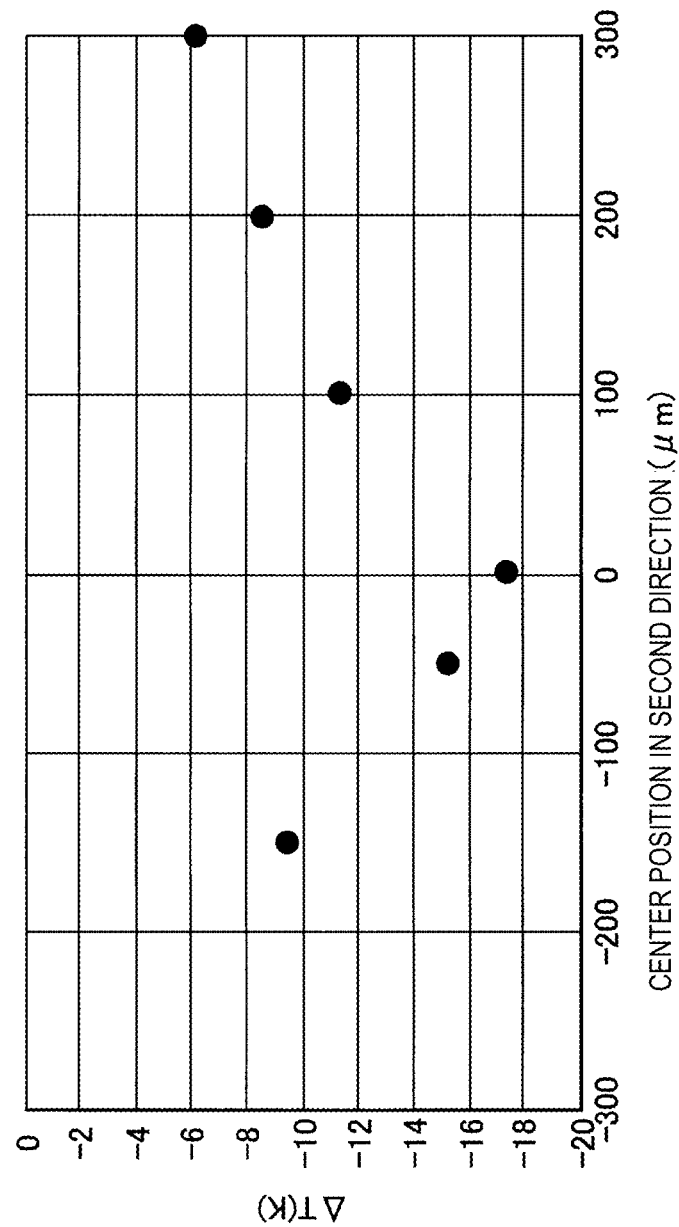
FIG. 12 is a graph for describing a relationship between a center position of a rectangular bump in a second direction and a temperature drop in a power amplification device according to a second example.

FIG. 12 is a graph for describing a relationship between a center position of a rectangular bump in a second direction and a temperature drop in a power amplification device according to a second example. The graph shown in FIG. 12 shows the temperature drop $\Delta T$ when a position of the rectangular bump 15 in the second direction Dy is changed in the configuration in which arrangement directions of the pluralities of transistors Tr are different between the first amplifier 11 and the second amplifier 12A, as illustrated in the fourth embodiment. A horizontal axis of the graph shown in FIG. 12 indicates a center position of the rectangular bump 15 in the second direction Dy with reference to the position of the center C1 of the first reference potential bump 21 in the second direction Dy.

As in the first example, as shown in FIG. 12, when the center position of the rectangular bump 15 in the second direction Dy is 0 µm, that is, when the center position of the rectangular bump 15 in the second direction Dy coincides with the center C1 of the first reference potential bump 21 in the second direction Dy, the temperature drop $\Delta T$ becomes the largest. The temperature drop ΔT decreases as the center position in the second direction Dy shifts in the + direction and the − direction.

Fifth Embodiment

Figure 13:
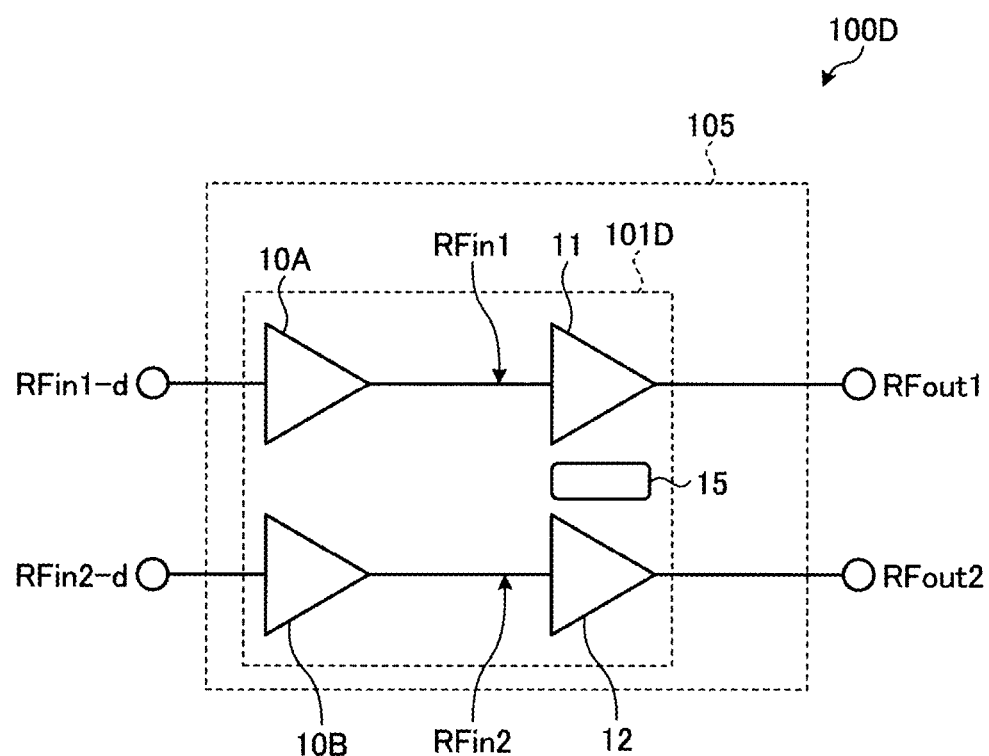
FIG. 13 is a block diagram illustrating a configuration of a power amplification device according to a fifth embodiment.
Figure 14:
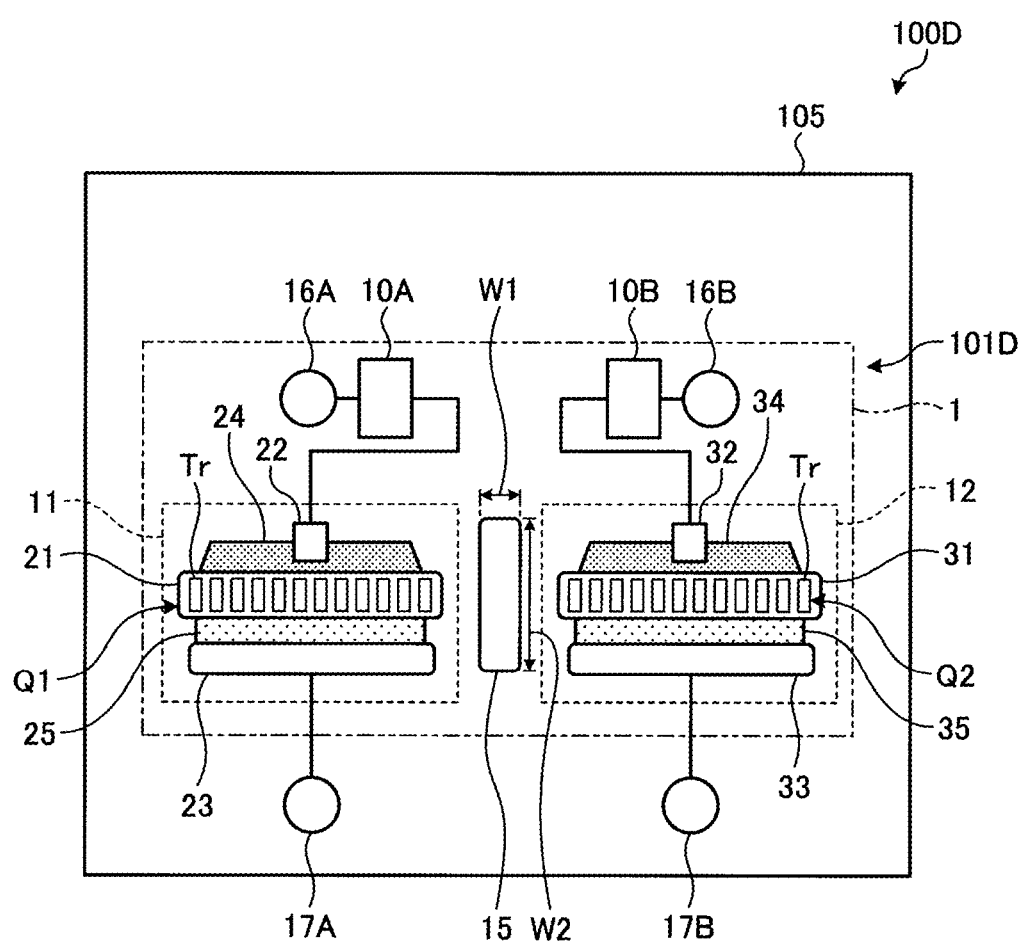
FIG. 14 is a plan view illustrating the power amplification device according to the fifth embodiment.

FIG. 13 is a block diagram illustrating a configuration of a power amplification device according to a fifth embodiment. FIG. 14 is a plan view illustrating the power amplification device according to the fifth embodiment. In the fifth embodiment, unlike the first embodiment to the fourth embodiment, description will be made of a configuration in which the first amplifier 11 and the second amplifier 12 respectively output the first output signal RFout1 and the second output signal RFout2 as an output of a power amplification device 100D.

As illustrated in FIG. 13, a semiconductor element 101D included in the power amplification device 100D includes a first drive stage amplifier 10A and a second drive stage amplifier 10B in addition to the first amplifier 11, the second amplifier 12, and the rectangular bump 15.

The first drive stage amplifier 10A amplifies an input first radio frequency input signal RFin1-d, and outputs the first radio frequency signal RFin1. The first amplifier 11 amplifies the first radio frequency signal RFin1, and outputs the first output signal RFout1.

The second drive stage amplifier 10B amplifies an input second radio frequency input signal RFin2-d, and outputs the second radio frequency signal RFin2. The second amplifier 12 amplifies the second radio frequency signal RFin2, and outputs the second output signal RFout2.

The second radio frequency input signal RFin2-d input to the second drive stage amplifier 10B is another signal independent of the first radio frequency input signal RFin1-d. Also, the second radio frequency signal RFin2 input to the second amplifier 12 is another signal independent of the first radio frequency signal RFin1. The power amplification device 100D outputs the first output signal RFout1 and the second output signal RFout2 as output signals independent of each other.

As illustrated in FIG. 14, the semiconductor substrate 1 is provided with the first drive stage amplifier 10A, the second drive stage amplifier 10B, and terminals 16A and 16B. In the module substrate 105, terminals 17A and 17B are provided.

The first radio frequency input signal RFin1-d is input to the terminal 16A. The terminal 16A is connected to the first drive stage amplifier 10A, and the first drive stage amplifier 10A is connected to the input terminal 22 of the first amplifier 11. The output terminal 23 of the first amplifier 11 is connected to the terminal 17A. The terminal 17A outputs the first output signal RFout1.

The second radio frequency input signal RFin2-d is input to the terminal 16B. The terminal 16B is connected to the second drive stage amplifier 10B, and the second drive stage amplifier 10B is connected to the input terminal 32 of the second amplifier 12. The output terminal 33 of the second amplifier 12 is connected to the terminal 17B. The terminal 17B outputs the second output signal RFout2.

In the present embodiment, the first amplifier 11 and the second amplifier 12 can operate independently of each other. Even when the first amplifier 11 and the second amplifier 12 operate at the same time, the rectangular bump 15 is provided, and thus the power amplification device 100D and the semiconductor element 101D can improve heat dissipation characteristics.

Note that the power amplification device 100D and the semiconductor element 101D according to the fifth embodiment can be combined as appropriate with the configurations of the second embodiment to the fourth embodiment described above.

Note that the above-described embodiments are intended to facilitate understanding of the present disclosure and are not intended to limit the present disclosure. The present disclosure can be modified/improved without departing from the gist thereof, and the present disclosure also includes equivalents thereof.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor element comprising:
a semiconductor substrate;
a first amplifier and a second amplifier provided on the semiconductor substrate and adjacent to each other in a first direction;
a first reference potential bump provided on a main surface of the semiconductor substrate, and connecting the first amplifier and a reference potential to each other;
a second reference potential bump provided on the main surface of the semiconductor substrate, and adjacent to the first reference potential bump in the first direction, and connecting the second amplifier and the reference potential to each other; and
a rectangular bump provided on the main surface of the semiconductor substrate, provided between the first reference potential bump and the second reference potential bump in a plan view from a direction perpendicular to the main surface, and a second width in a second direction orthogonal to the first direction is larger than a first width in the first direction, wherein
the second width of the rectangular bump is larger than a width of at least one of the first reference potential bump and the second reference potential bump in the second direction.

2. The semiconductor element according to claim 1, wherein
the rectangular bump intersects with a virtual line connecting a center of a width of the first reference potential bump in the second direction and a center of a width of the second reference potential bump in the second direction.

3. The semiconductor element according to claim 1, wherein
a height of the rectangular bump in a direction perpendicular to the main surface of the semiconductor substrate is equal to heights of the first reference potential bump and the second reference potential bump in the direction perpendicular to the main surface of the semiconductor substrate.

4. The semiconductor element according to claim 1, wherein
each of the first amplifier and the second amplifier includes a plurality of transistors arrayed in the first direction, and
each of the first reference potential bump and the second reference potential bump is disposed in a region overlapping the plurality of the transistors, and a width in the first direction is larger than a width in the second direction.

5. The semiconductor element according to claim 1, wherein
- each of the first amplifier and the second amplifier includes a plurality of transistors arrayed in the second direction, and
- each of the first reference potential bump and the second reference potential bump is disposed in a region overlapping the plurality of the transistors, and a width in the second direction is larger than a width in the first direction.

6. The semiconductor element according to claim 1, wherein
- the first amplifier includes a plurality of transistors arrayed in the first direction,
- the second amplifier includes a plurality of transistors arrayed in the second direction,
- the first reference potential bump is disposed in a region overlapping the plurality of the transistors arrayed in the first direction, and a width in the first direction is larger than a width in the second direction, and
- the second reference potential bump is disposed in a region overlapping the plurality of the transistors arrayed in the second direction, and a width in the second direction is larger than a width in the first direction.

7. The semiconductor element according to claim 1, further comprising:
- a concave portion provided in or on the main surface of the semiconductor substrate; and
- a metal layer provided in the concave portion, wherein the rectangular bump is provided so as to overlap the metal layer.

8. The semiconductor element according to claim 4, wherein
- the plurality of the transistors is heterojunction bipolar transistors.

9. A power amplification device comprising:
- the semiconductor element according to claim 1; and
- a module substrate facing the semiconductor element and electrically connected to the semiconductor element, wherein
- the module substrate includes
  - an insulating substrate having a first surface facing the main surface of the semiconductor substrate, and a second surface opposite to the first surface, and
  - a plurality of first wirings provided on the first surface of the insulating substrate, connected to the first reference potential bump, the second reference potential bump, and the rectangular bump, and separated from each other.

10. The power amplification device according to claim 9, further comprising:
- a plurality of second wirings provided in an inner layer of the insulating substrate, laminated with the plurality of the first wirings with a dielectric layer interposed between the plurality of first wirings and the plurality of second wirings, and separated from each other; and
- a third wiring laminated with the plurality of the second wirings with a dielectric layer interposed between the plurality of second wirings and the third wiring, and commonly provided at a position further away from the first surface than the plurality of the second wirings, wherein
- the rectangular bump is electrically connected to the first reference potential bump and the second reference potential bump with the third wiring commonly provided and interposed between each of the first reference potential bump and the second reference potential bump and the rectangular bump.

11. The semiconductor element according to claim 2, wherein
- a height of the rectangular bump in a direction perpendicular to the main surface of the semiconductor substrate is equal to heights of the first reference potential bump and the second reference potential bump in the direction perpendicular to the main surface of the semiconductor substrate.

12. The semiconductor element according to claim 2, wherein
- each of the first amplifier and the second amplifier includes a plurality of transistors arrayed in the first direction, and
- each of the first reference potential bump and the second reference potential bump is disposed in a region overlapping the plurality of the transistors, and a width in the first direction is larger than a width in the second direction.

13. The semiconductor element according to claim 3, wherein
- each of the first amplifier and the second amplifier includes a plurality of transistors arrayed in the first direction, and
- each of the first reference potential bump and the second reference potential bump is disposed in a region overlapping the plurality of the transistors, and a width in the first direction is larger than a width in the second direction.

14. The semiconductor element according to claim 2, wherein
- each of the first amplifier and the second amplifier includes a plurality of transistors arrayed in the second direction, and
- each of the first reference potential bump and the second reference potential bump is disposed in a region overlapping the plurality of the transistors, and a width in the second direction is larger than a width in the first direction.

15. The semiconductor element according to claim 3, wherein
- each of the first amplifier and the second amplifier includes a plurality of transistors arrayed in the second direction, and
- each of the first reference potential bump and the second reference potential bump is disposed in a region overlapping the plurality of the transistors, and a width in the second direction is larger than a width in the first direction.

16. The semiconductor element according to claim 2, wherein
- the first amplifier includes a plurality of transistors arrayed in the first direction,
- the second amplifier includes a plurality of transistors arrayed in the second direction,
- the first reference potential bump is disposed in a region overlapping the plurality of the transistors arrayed in the first direction, and a width in the first direction is larger than a width in the second direction, and
- the second reference potential bump is disposed in a region overlapping the plurality of the transistors arrayed in the second direction, and a width in the second direction is larger than a width in the first direction.

17. The semiconductor element according to claim 2, further comprising:

a concave portion provided in or on the main surface of the semiconductor substrate; and a metal layer provided in the concave portion, wherein the rectangular bump is provided so as to overlap the metal layer.

18. The semiconductor element according to claim 5, wherein the plurality of the transistors is heterojunction bipolar transistors.

19. A power amplification device comprising:

the semiconductor element according to claim 2; and a module substrate facing the semiconductor element and electrically connected to the semiconductor element, wherein the module substrate includes an insulating substrate having a first surface facing the main surface of the semiconductor substrate, and a second surface opposite to the first surface, and a plurality of first wirings provided on the first surface of the insulating substrate, connected to the first reference potential bump, the second reference potential bump, and the rectangular bump, and separated from each other.

20. The power amplification device according to claim 19, further comprising:

a plurality of second wirings provided in an inner layer of the insulating substrate, laminated with the plurality of the first wirings with a dielectric layer interposed between the plurality of first wirings and the plurality of second wirings, and separated from each other; and a third wiring laminated with the plurality of the second wirings with a dielectric layer interposed between the plurality of second wirings and the third wiring, and commonly provided at a position further away from the first surface than the plurality of the second wirings, wherein the rectangular bump is electrically connected to the first reference potential bump and the second reference potential bump with the third wiring commonly provided and interposed between each of the first reference potential bump and the second reference potential bump and the rectangular bump.

* * * * *